United States Patent
Takahashi et al.

[11] Patent Number: 5,155,673
[45] Date of Patent: Oct. 13, 1992

[54] THYRISTOR CONVERTER PROTECTION METHOD AND APPARATUS

[75] Inventors: Tadashi Takahashi, Kanagawa; Katsuro Ito, Tokyo, both of Japan

[73] Assignee: Kabushiki Kaisha Toshiba, Kawasaki, Japan

[21] Appl. No.: 697,615

[22] Filed: May 9, 1991

[30] Foreign Application Priority Data

May 14, 1990 [JP] Japan .................. 2-121187

[51] Int. Cl.⁵ ............................. H02M 7/515
[52] U.S. Cl. ............................. 363/54; 363/57; 363/85; 363/128; 323/902; 361/91
[58] Field of Search ............. 363/85, 96, 128, 135, 363/136, 139, 54, 57; 323/902; 361/90, 91, 111

[56] References Cited

U.S. PATENT DOCUMENTS 4,377,835 3/1983 Asplund et al. .
4,785,388 11/1988 Takahashi .................. 363/54 X

FOREIGN PATENT DOCUMENTS 2519396 11/1976 Fed. Rep. of Germany .

OTHER PUBLICATIONS

Patent Abstracts of Japan, vol. 11, No. 113(E-497)[2560], Apr. 9, 1987, & JP-A-61-262077, Nov. 20, 1986, K. Ito et al., "Protecting Device for Semiconductor Element".

Primary Examiner—Emanuel T. Voeltz
Attorney, Agent, or Firm—Oblon, Spivak, McClelland, Maier & Neustadt

[57] ABSTRACT

A method and apparatus for protecting thyristors in a power converter from overvoltages. Voltage detectors determine if the forward voltage of each thyristor has increased in the converter. If such an overvoltage occurs during a predetermined period after the conduction of the thyristor, forced triggering of all the thyristors prevent damage to the thyristors.

9 Claims, 6 Drawing Sheets

THYRISTOR CONVERTER PROTECTION METHOD AND APPARATUS

BACKGROUND OF THE INVENTION

1. Field of the Invention

The present invention relates generally to a protection method and apparatus for thyristors in a power converter and more particularly to a protection method for thyristors using forced triggering signals.

2. Discussion of the Background

Thyristors are commonly used in power converters and similar applications. The thyristors may be arranged in a series connection or a series-parallel connection. While these devices have become common, a certain type of failure may occur when an unusual transient pulse occurs during a certain period of operation of the device.

FIG. 1 shows a prior art thyristor converter that is used for direct current power transmission. Incoming power is converted from alternating current to direct current or vice versa utilizing transformer 12 and thyristor converter 10. Reactor 13 helps to smooth the resultant current. An arm of the thyristor converter 10 is shown in FIG. 2 as including a number of thyristor converters $16_1..16_I..16_N$ arranged in series. The thyristors shown are light thyristors that are also connected to individual voltage dividing circuits $18_1..18_I..18_n$ which serve to make the thyristor voltages uniform. Light guides $14_1..14_I..14_N$ are light guides which transmit the trigger light signals from a pulse generator (not shown) to the respective thyristors. Arrestor 15 serves to suppress thyristor overvoltage. The number of thyristors, N, which are arranged in series is determined by the voltage rating of the converter.

FIG. 3 shows graphs of thyristor voltage and current over a period of time, when operating as an inverter. Circuit voltage $E_t$, determined by the main circuit, is imposed on the thyristor. At time $t_1$ this voltage falls to zero and the thyristor becomes conductive as seen by the graph of the thyristor current. At time $t_2$ the thyristor is turned off and circuit voltage $E_t$ is made negative. Since carriers remain inside the thyristor immediately after conduction, it is not possible to immediately achieve a forwardly-directed withstand voltage (forward recovery), but it is necessary first to impose a set reverse voltage period until the carriers are removed. This reverse voltage period is known as the margin angle, $\gamma$. If this reverse voltage period is too small, commutation failure may occur in the converter as a whole or there may be an occurrence of partial commutation failure known as partial self-triggering. This occurs when series connected thyristors include some elements in which triggering occurs and some elements where it does not occur. When this happens, the entire circuit voltage is then imposed on the elements where triggering does not take place. This results in the element breaking down due to overvoltage or element breakdown due to a self-triggering domino effect which accompanies a rise in voltage above a certain level. In order to compensate for this, other prior art devices have made use of forced triggering protection where triggering signals are forcibly supplied if the margin angle becomes too small due to a decrease in system voltage, voltage distortion or improper control. This protection helps prevent excessive stress on elements and prevents element breakdown. Thus, forced triggering is known to prevent self-triggering of thyristors during times of overvoltage or when the voltage is above a dangerous level. However, this approach has only been used during the margin angle (reverse voltage) period. Specifically, it has not proved satisfactory when overvoltage enters the converter immediately after conduction.

At time $t_2$ shown in FIG. 3, $E_t$ assumes a reverse voltage to start the margin angle. This period ends at time $t_3$, when $E_t$ becomes zero.

The thyristor recovery voltage $E_{tf}$ gradually increases when the residual carriers disappear during the margin angle. This voltage starts to increase from zero at a time $t_{20}$. This voltage increases and eventually crosses the voltage level $V_{pt}$ which corresponds to the protection level provided by the arrestor 15. It then continues until it reaches the forward withstand voltage $V_{DRM}$ at time $t_6$. For a high withstand voltage, large current thyristor, the time necessary to achieve forward recovery varies considerably within the range of 1.2 to 1.5 $T_q$, where $T_q$ is the on-off time. This forward recovery time is seen in the FIGURE as the time between $t_2$ and $t_6$.

As can be seen from FIG. 3, in normal operation $E_{tf}$ is greater than $E_t$ during the forward recovery time. Thus, the thyristor forward recovery voltage is always higher than the circuit voltage. However, during this time if a forwardly directed overvoltage occurs such as indicated by the dashed line at $t_{40}$, the circuit voltage may become greater than the forward recovery voltage for a short time. The thyristor may be unable to withstand this lower voltage and accordingly, the problem of self-triggering occurs. The thyristor will then breakdown if the voltage is above a certain value (designated as the limit self-triggering voltage $V_{stl}$). $V_{stl}$ may be approximately one-third to one-half of $V_{DRM}$. Since the occurrence of an overvoltage is random and may occur at any time, it is necessary to protect the thyristor elements during the time period of $t_2$ to $t_5$. After $t_5$ there is no problem since there is satisfactory recovery to the forward withstand voltage. During the time period $t_2$ to $t_3$ (the margin angle), it is possible to utilize conventional force triggering protection as described above. However, during the time period $t_3$ to $t_5$, prior art devices cannot provide protection. Accordingly, during this vulnerable period the thyristors may breakdown due to overvoltage.

SUMMARY OF THE INVENTION

Accordingly, one object of this invention is to provide a novel method and apparatus for applying a forced triggering signal to all thyristors when an overvoltage is applied.

It is another object of the present invention to provide a novel method and apparatus for forecasting the imposition of a forwardly-directed overvoltage immediately after the termination of the thyristor current.

It is another object of the present invention to detect a high voltage at each thyristor and to impose a forced trigger signal to all thyristors when an overvoltage occurs.

It is a still further object of this invention to provide a novel method and apparatus for protecting thyristors by detecting voltages at each thyristor and imposing a forced supply of triggering signals if the overvoltage occurs during the desired protection period.

It is a still further object of the present invention to provide a novel method and apparatus for protecting thyristors by applying a forced trigger pulse to the thyristors if either a voltage higher than a set level or a voltage rise rate which exceeds a set value is detected in the forward voltage recovery protection period.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a block diagram of a third embodiment of the present invention; and

DESCRIPTION OF THE PREFERRED EMBODIMENTS

Figure 4:
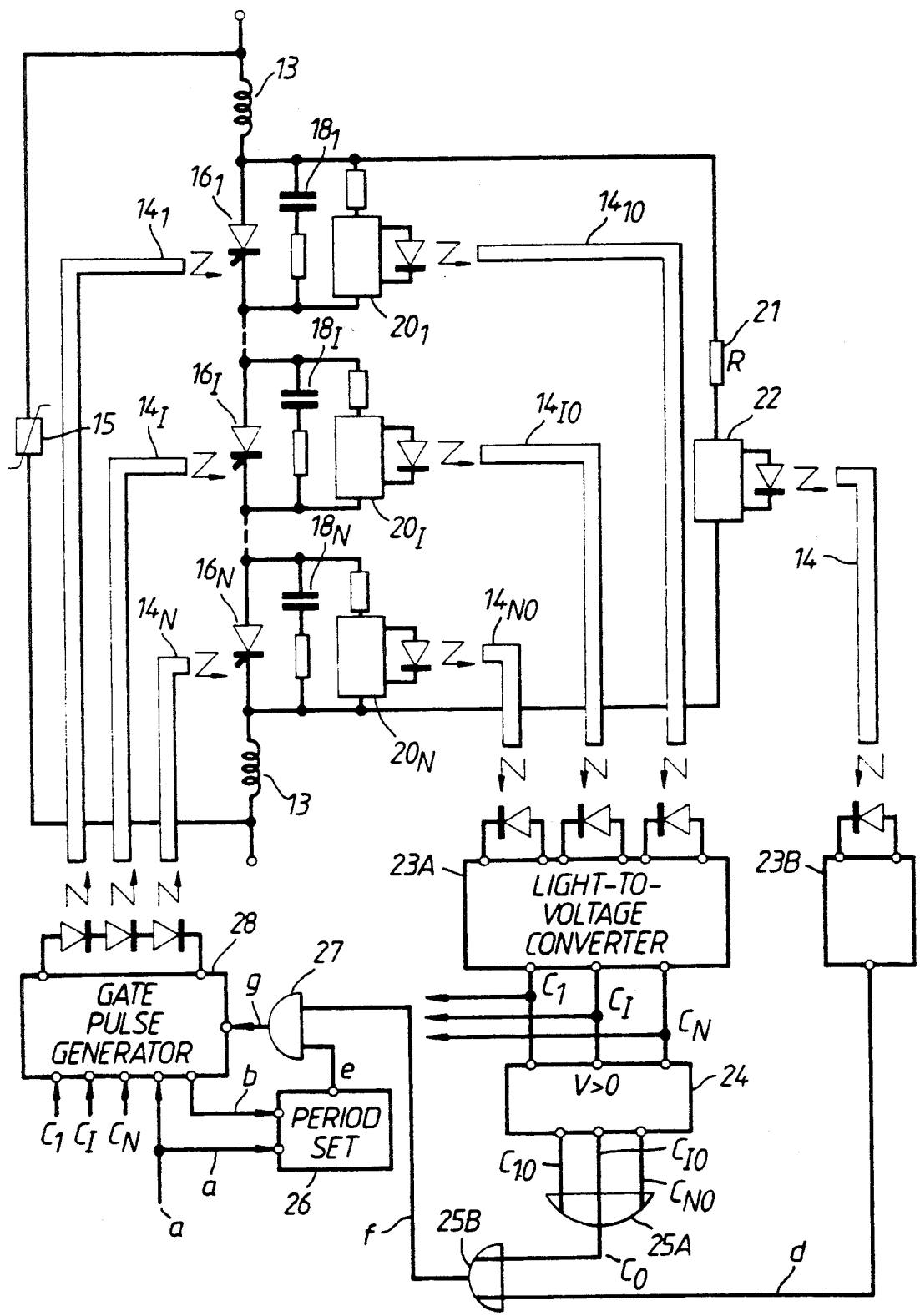
FIG. 4 is a block diagram of the first embodiment of the present invention.

Various other objects, features and attendant advantages of the present invention will be more fully appreciated as the same becomes better understood from the following detailed description when considered in connection with the accompanying drawings in which like reference characters designate like or corresponding parts throughout the several views and wherein FIG. 4 shows the first embodiment of the present invention. Thyristors $16_1..16_I..16_N$ are arranged in series between reactors 13 and in parallel to arrestor 15. Light guides $14_1..14_I..14_N$ transmit light signals to trigger the thyristors. Voltage dividing circuits $18_1..18_I18_N$ and forward voltage detection circuits $20_1..20_I..20_N$ are provided for each thyristor. The forward voltage detection circuits determine the forward voltage for each thyristor and transmit a light signal indicative of this voltage through light guides $14_{10}..14_{I0}..14_{N0}$. These light signals are then converted back to voltage signals $C_1..C_I..C_N$ in circuit 23a. Thus, each of these signals indicates the forward voltage for each corresponding thyristor.

Figure 1:
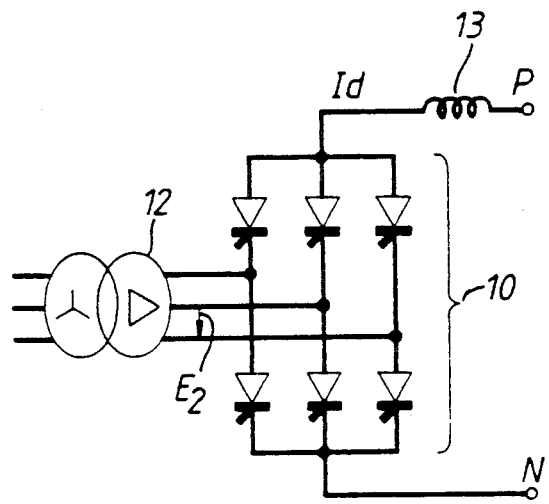
FIG. 1 is a block diagram of a prior art thyristor converter.
Figure 2:
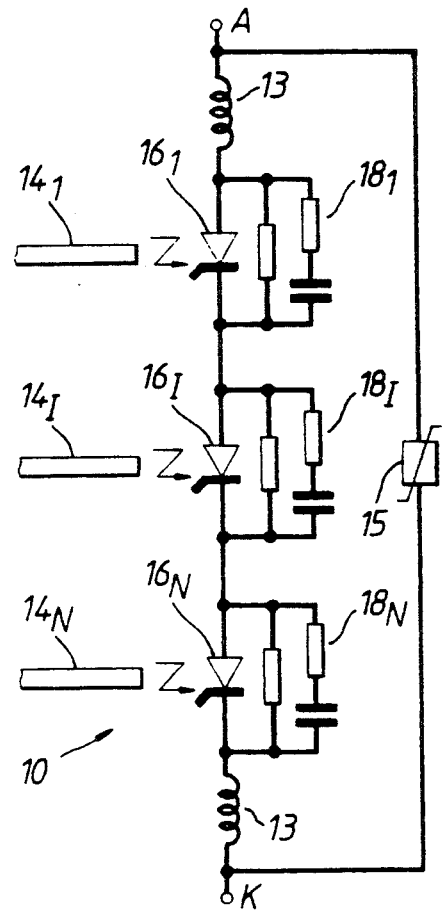
FIG. 2 is a block diagram of a thyristor valve in FIG. 1.
Figure 3:
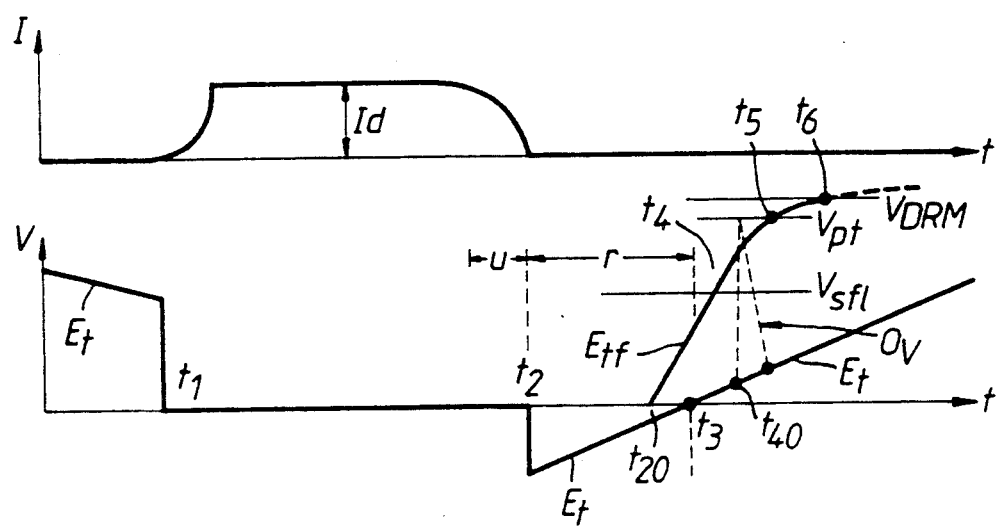
FIG. 3 is a graph describing the voltage and current of the device shown in FIG. 2.

At the same time, an overvoltage for the thyristor valve as a whole (total voltage of the elements) is detected by overvoltage detection resistor 21 and overvoltage detection circuit 22. This voltage is also converted to a light signal and transmitted to a converter circuit 23b to reform an electrical signal, d. The overvoltage detection level in circuit 22 is set at slightly lower than N times the self-triggering voltage limit, $V_{stl}$ (shown in FIG. 3). Thus, overvoltage signal d indicates that the circuit as a whole has reached a dangerous overvoltage condition.

A forward voltage signal processing circuit 24 detects the forward voltage signal for each thyristor and determines whether each signal has reached zero. When the zero level is reached, output signals $C_{10}..C_{I0}..C_{N0}$ are produced. The signals are combined in an OR gate 25A to produce output $C_O$. Similarly, this signal and signal d are combined in OR gate 25B to produce output signal f. Thus, this signal provides an indication that at least one of the thyristors or the circuit as a whole has an unusual forward voltage signal.

A protection period setting circuit 26 determines the protection period for the device. That is, it determines the period $t_3-t_5$ during which time the thyristors are vulnerable to an overvoltage failure. Output signal e is indicative of this time period. The period setting circuit receives input signal a which starts at time t and ends at time $t_2$. This signal is indicative of the conduction period and is usually 120°. This signal is received from a converter control unit (not shown). Signal b, which is indicative of the reverse voltage period (margin angle) $t_2-t_3$ is also received by the period setting circuit. This signal allows the period setting circuit to determine the beginning of the protection period signal e. This signal is received by AND gate 27 which also receives signal f. When both signals are present, a signal g is given to gate pulse generator 28 which then outputs light signals through the light guides $14_1..14_I..14_N$ to forcibly trigger the thyristors. This then protects the thyristors during the invulnerable time $t_3-t_5$ but only if an overvoltage situation is sensed either in an individual thyristor or in the circuit as a whole.

Gate pulse generator 28 also produces other signals. The generator receives forward voltage signals $C_1..C_IC_N$ from the circuit 23A. Signal b is produced by the end of signal a and the beginning of the C signals.

The end point of signal e is determined in the period setting circuit 26 by setting the maximum value expected for the length of this pulse.

Figure 5B:
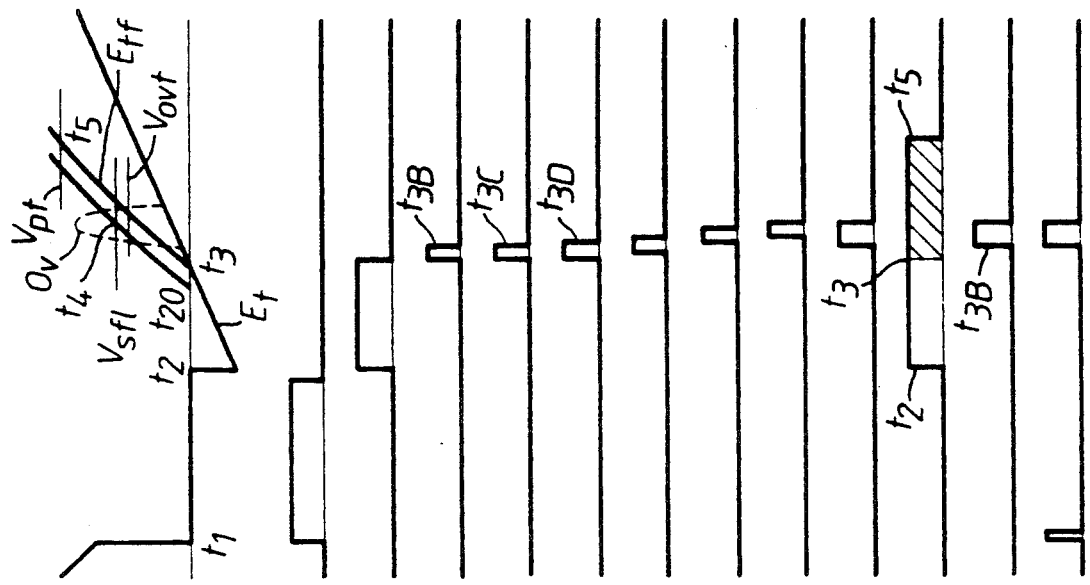
FIGS. 5a and 5b are time charts of various signals which occur in the apparatus of FIG. 4 during normal conditions and overvoltage conditions, respectively.
Figure 5A:

FIG. 5a shows the normal operation of the device of FIG. 4 without an overvoltage while FIG. 5b shows the operation of the same device when an overvoltage occurs. The top line in each figure is similar to the timing chart in FIG. 3 except that two different lines are provided for $E_{if}$. This is to indicate a range of possible voltages which occur normally in slightly differing thyristors. In FIG. 5b, the overvoltage signal is indicated by a dotted line. In both figures, signals a and b indicate the respective time periods $t_1-t_2$ and $t_2-t_3$. Under normal conditions, the various C signals detect a zero voltage at time $t_3$ and stay at the "1" voltage level since no overvoltage is determined. On the other hand, in the overvoltage situation, the C signals start at the "1" level at time $t_3$ and change to the "0" level at times $t_{3B}-t_{3D}$. There are slight differences in the sensed times since there are slight differences in the characteristics of the various thyristors. However, at their individual times self-triggering occurs. The first self-triggering signal $C_1$ causes signal $C_0$ to occur. This then also causes the generation of signal g from AND gate 27 since it occurs during the time period $t_3-t_5$, as determined by signal e. Signal g then causes forced triggering signals to be supplied to all the thyristors.

In the example shown, signal d is not produced since self-triggering takes place before the overvoltage reaches the overvoltage detection level $V_{OvT}$ for the thyristor valve as a whole. However, if an overvoltage occurs where the voltage is comparatively low and the change in voltage over time is small and occurs during the time period $t_4-t_5$, it may be difficult for self-triggering to take place. As a result, the overvoltage is detected when it becomes greater than the detection level and an overvoltage signal d and forced triggering signal g are produced to cause forced triggering signals to be supplied to the thyristors.

Although the protection period has been set at $t_3-t_5$, it is also possible to instead use the protection period as $t_2-t_5$ and omit the conventional protection for forced triggering when the margin angle is small. This can be done by setting the period setting circuit 26 to produce signal e at the beginning of received signal b rather than the end thereof.

One form of converter control protection action is to cause gate shifts. If there are concerns that this could cause unwanted action by self-triggering detection signals $C_0$ and overvoltage detection signals d, it is possible to temporarily lock these two signals by the gate shift signals.

The above embodiment utilizes a single signal processing arrangement which receives signals from detectors associated with each of the thyristors. It is also possible to instead utilize a detection device which detects only voltage from one representative thyristor.

Figure 6:
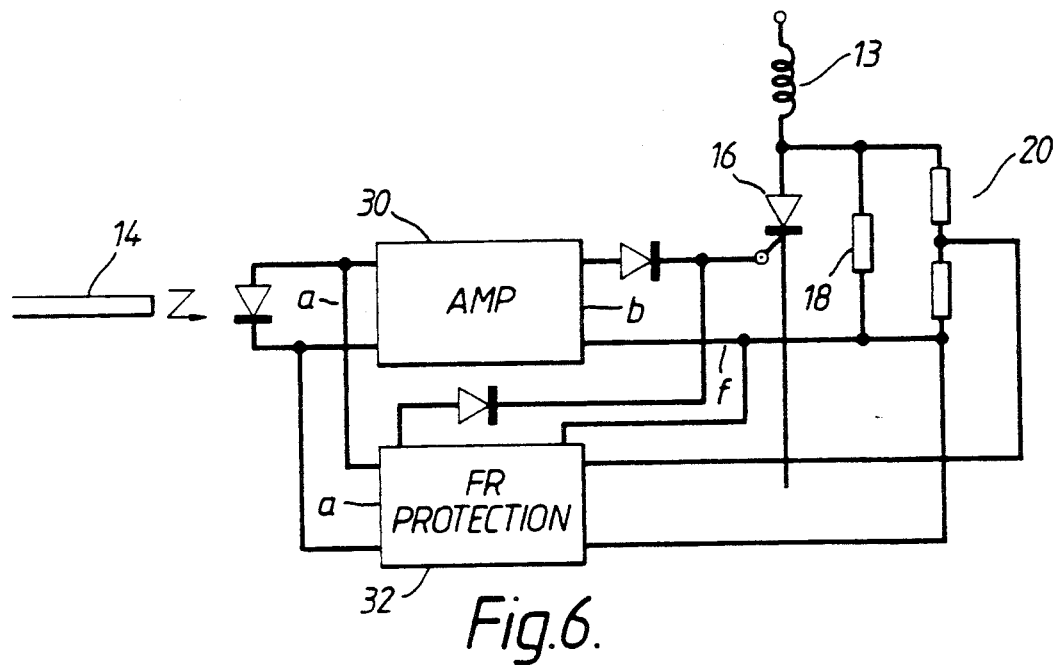
FIG. 6 is a block diagram of a second embodiment of the present invention.

The second embodiment of the invention is shown in FIG. 6. Voltage detector 20 detects the voltage or rate of change of the voltage of thyristor 16. A voltage divider circuit 18 is connected to the thyristor in a manner similar to FIG. 4. Likewise, the reactor 13 is connected to one terminal of the thyristor. The voltage detector 20 is a circuit made of resistors or a combination of a resistor and a capacitor. The detected voltage is received by forward voltage recovery protection circuit 32 which serves to determine the protection period and to detect overvoltages. A forced trigger signal may then be applied to the thyristor. A light triggering signal is carried by light guide 14 and converted to a voltage signal a. This signal is amplified to produce signal b which is applied to the thyristor and which determines the turn on period of the thyristor. Signal a is also applied to the overvoltage recovery protection circuit to determine the proper time protection.

Figure 7:
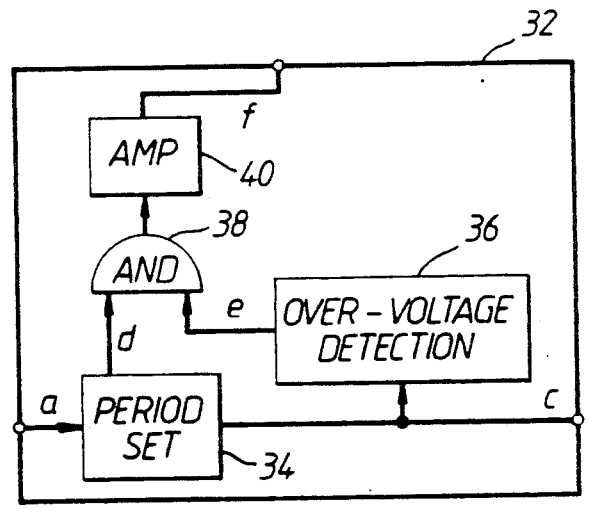
FIG. 7 is a block diagram of the forward recovery protection circuit shown in FIG. 6.

FIG. 7 shows a more detailed block diagram of the forward voltage recovery protection circuit 32. A protection period setting circuit 34 receives input signal a and voltage detection circuit c from the voltage detector 20 to determine the protection period which lasts for a set time from zero voltage $t_3$. An overvoltage detection circuit 36 receives output c from the voltage detector 20 and produces an overvoltage signal e if it exceeds a set level ($V_{OL}$ or shown in FIG. 9). If AND gate 38 receives signal e at the same time as signal d representing the desired protection period, a gate trigger signal command is produced and amplified in amplifier 40 to produce forced trigger signal f which is applied to the thyristor gate as shown in FIG. 6.

Figure 8:
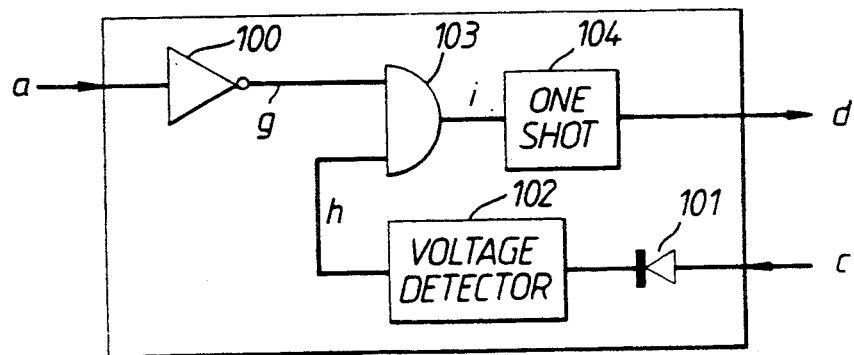
FIG. 8 is a block diagram of the period setting circuit shown in FIG. 7.

FIG. 8 shows one embodiment of the protection period setting circuit 34. Input signal a is applied to a inverter 100 whose output g is received by AND gate 103. Input signal c is received by diode 101 which is connected to voltage detector 102. The output of the voltage detector, signal h, is also applied to AND gate 103. The output of AND gate 103, signal i, is applied to one shot multivibrator 104 which produces output signals d.

Figure 9:
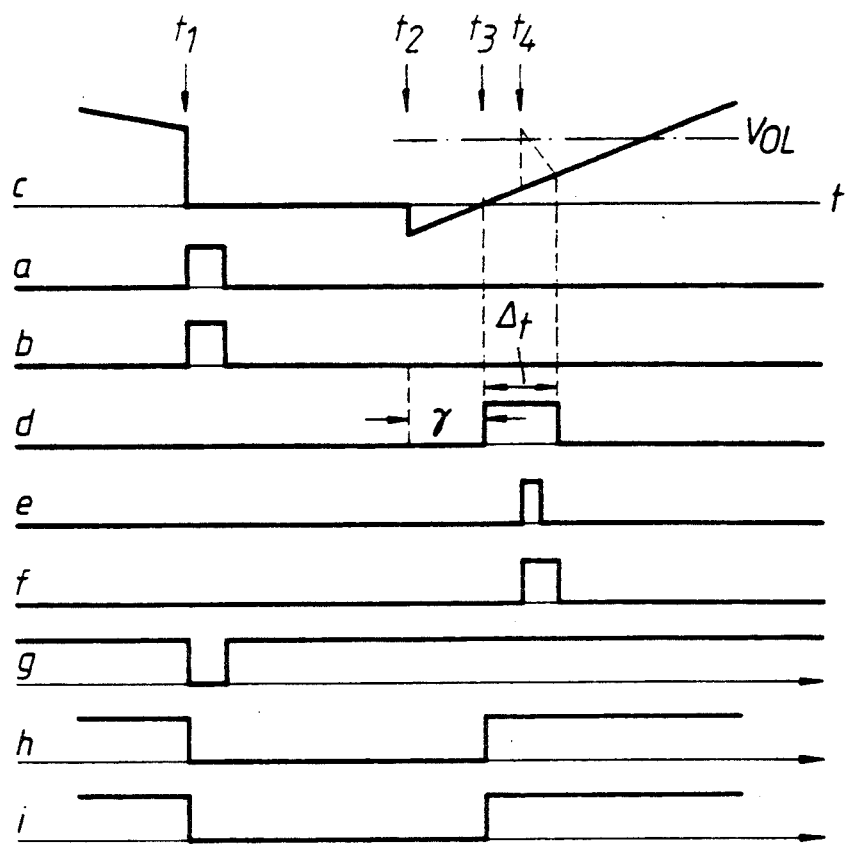
FIG. 9 is a time chart of signals which occurs in FIGS. 7 and 8.

FIG. 9 shows a time chart of the various signals found in FIGS. 6, 7 and 8. The top line is similar to the time charts in FIGS. 3 and 5. As can be seen in the FIGURE, signal g is merely the inverse of signal a. Signal h is produced by the voltage detector 102 when signal c reaches the zero point at $t_3$. The conjunction of these two signals in AND gate 103 causes one shot 104 to produce a signal d of width $\Delta t$.

Figure 10:
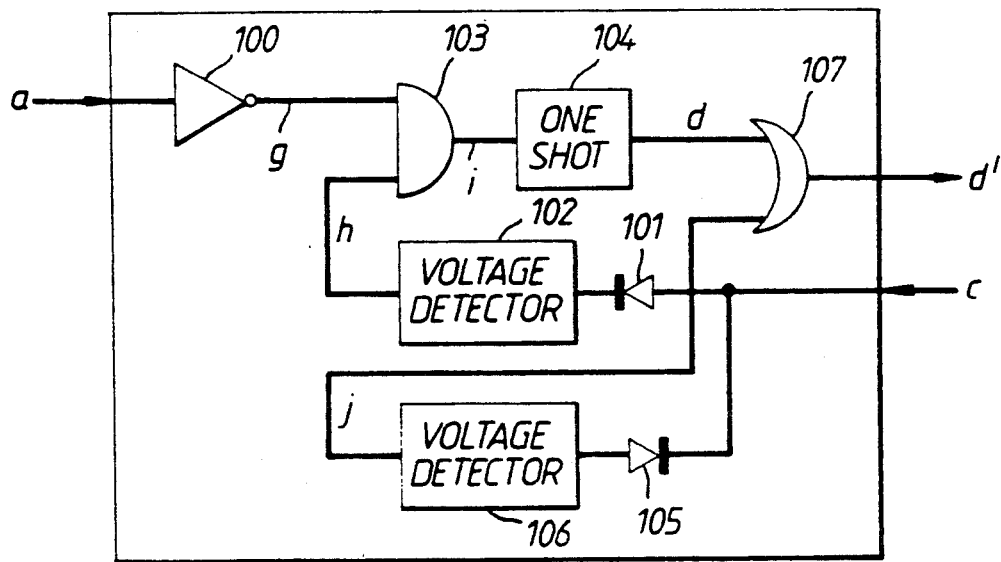
FIG. 10 is a block diagram of a second embodiment of the period setting circuit shown in FIG. 7.

FIG. 10 shows another embodiment of the circuit shown in FIG. 8. However, in this circuit input c is also applied to diode 105 and a second voltage detector 106. A voltage detector determines when the voltage of c is negative, that is, $t_2-t_3$. This produces signal j which is combined with signal d from one shot 104 in OR gate 107 to produce a new output signal d'.

Figure 11:
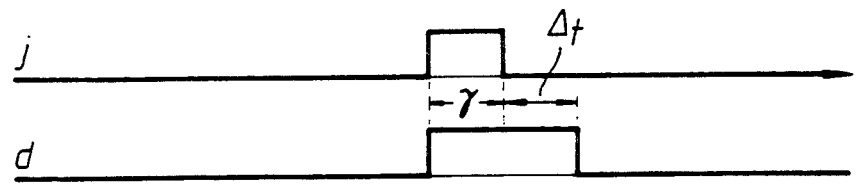
FIG. 11 is a time chart of signals shown in FIG. 10.
Figure 12:
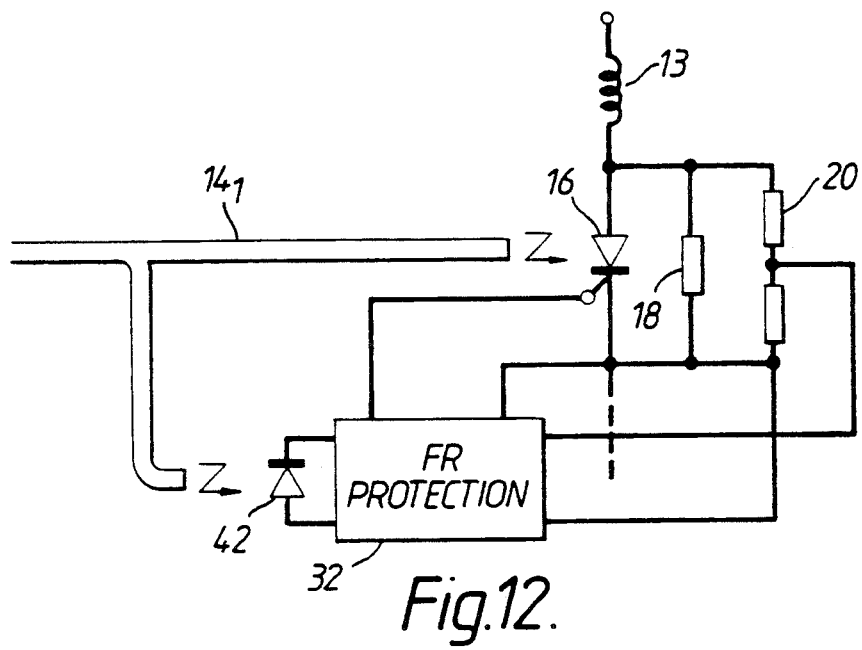

FIG. 11 shows signals j and d' from FIG. 12. As can be seen, signal j merely adds the margin angle to the existing $\Delta t$ in the OR gate to produce the output d' which includes the time $t_2-t_5$. As mentioned above in regard to FIGS. 4 and 5, the protection signal may be extended to include the margin angle desired.

FIG. 12 shows another embodiment of the present invention. In this embodiment, the thyristors utilized are electrical and light trigger thyristors which have both electrical and light trigger inputs. The same forward recovery protection found in FIG. 6 may be possible by replacing the single branch type light guide 14 of FIG. 6 with a partially branched light guide $14_1$ (2-branch type).

Figure 13:
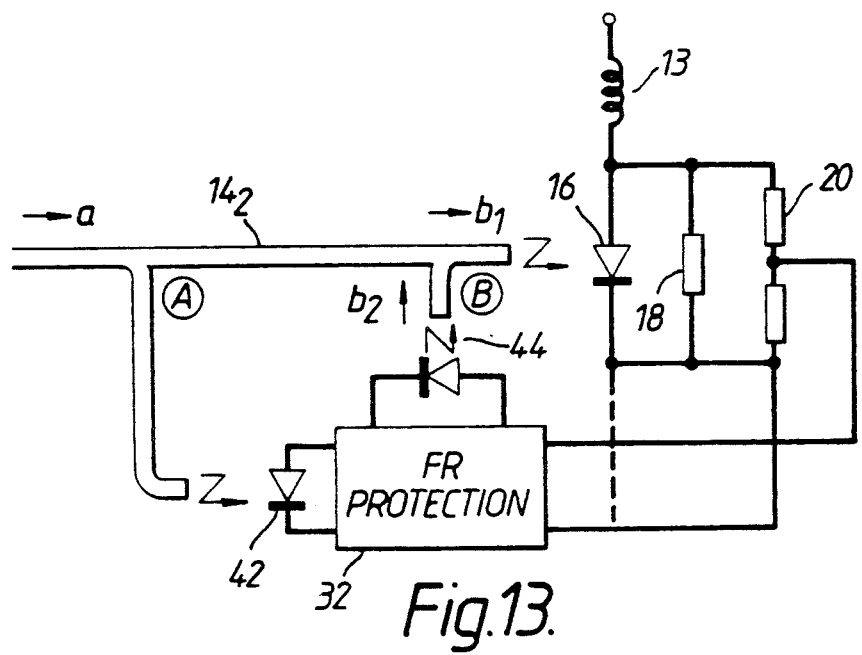
FIG. 13 is a block diagram of a fourth embodiment of the present invention.

FIG. 13 shows another embodiment of the present invention used with light trigger thyristors. The light guide 14 of FIG. 6 is replaced by a 2×2 branched light guide $14_2$ in order to have the same forward recovery protection as in FIG. 6. A gate trigger command signal, a, is partially branched at point A and leads to photoreceptor element 42 of the FR protection circuit 32. The output of the protection circuit 32 is sent through light-emitting element 4 and reenters the light guide at point B so that signals b1 (which is the same as A) and b2 both enter the thyristor.

The embodiments described above make it possible to ensure a forced triggering protection against overvoltage during the period immediately after the thyristor turn off in a system where each thyristor is provided with a voltage detector and a FR protection circuit. Since protection is effected for each individual thyristor in the series, protection is provided at high speed and it is possible to protect the device even against very fast lightning surge overvoltage.

Having now fully described the invention, it will be apparent to one of ordinary skill in the art that many changes and modifications can be made thereto without departing from the spirit or scope of the invention as set forth herein.

What is claimed as new and desired to be secured by Letters Patent of the United States is:

1. A method of protecting a thyristor in a thyristor valve from damage, comprising the steps of:
   detecting a forward voltage of the thyristor;
   determining if the forward voltage equals a predetermined voltage;
   determining a set time period following the conduction period of the thyristor, said set time period starting at a time when the circuit voltage becomes zero from a reverse voltage; and generating a forced supply of triggering signals when the detected voltage equals said predetermined voltage during the set time period.

2. A method according to claim 1, wherein said triggering signals are generated if the forward voltage becomes zero during said set time period.

3. A method according to claim 1, wherein said thyristor is connected to a plurality of similar thyristors and where said triggering signals are generated if the forward voltage imposed on the thyristors in said set time period equals a set value.

4. A method according to claim 1, wherein said set time period includes a margin angle.

5. A method according to claim 1, wherein said predetermined voltage is set to a limit self-triggering voltage.

6. An apparatus for protecting a thyristor in a thyristor valve comprising:

a forward voltage detecting means for detecting the forward voltage of said thyristor;

an overvoltage detecting means for determining if said forward voltage of said thyristor equals a predetermined voltage;

a period setting means for determining a set time period following the conduction period of said thyristor, said set time period starting at a time when the circuit voltage becomes zero from a reverse voltage; and means for generating a forced supply of triggering signals when the detected voltage equals said predetermined voltage during the set time period.

7. An apparatus according to claim 6, wherein said thyristor is connected in series with a plurality of similar thyristors each of said thyristors having a corresponding forward voltage detecting means.

8. An apparatus according to claim 6, wherein said set period includes a margin angle.

9. An apparatus according to claim 6, wherein said predetermined voltage is set to a limit self-triggering voltage.

* * * * *